United States Patent
Schein et al.

(10) Patent No.: US 6,208,158 B1
(45) Date of Patent: Mar. 27, 2001

(54) ZERO STATIC FORCE ASSEMBLY FOR WIRELESS TEST FIXTURES

(75) Inventors: Charles A. Schein; Silvano A. Romeo, both of Glenview, IL (US)

(73) Assignee: Schein Research, Inc., Glenview, IL (US)

( * ) Notice: Subject to any disclaimer, the term of this patent is extended or adjusted under 35 U.S.C. 154(b) by 0 days.

(21) Appl. No.: 09/089,702

(22) Filed: Jun. 3, 1998

(51) Int. Cl.⁷ .................................................. G01R 1/073
(52) U.S. Cl. ............................................................. 324/761
(58) Field of Search .................... 324/761, 754, 324/758, 757

(56) References Cited

U.S. PATENT DOCUMENTS

| | | |
|---|---|---|
| 4,420,882 | 12/1983 | Ritchie et al. . |
| 4,428,635 | 1/1984 | Hamsher, Jr. et al. . |
| 4,503,609 | 3/1985 | Mackay . |
| 4,503,610 | 3/1985 | Resch . |
| 4,627,161 | 12/1986 | Cushman . |
| 4,749,945 * | 6/1988 | Bonifert et al. ................. 324/761 |
| 4,967,147 * | 10/1990 | Woods, Jr et al. ............... 324/761 |
| 5,002,499 | 3/1991 | Matsuoka . |
| 5,192,221 | 3/1993 | Matsuoka et al. . |
| 5,227,718 | 7/1993 | Stowers et al. . |
| 5,256,080 | 10/1993 | Bright . |
| 5,283,518 * | 2/1994 | King et al. .................... 324/761 |
| 5,387,121 | 2/1995 | Kurz . |
| 5,534,787 * | 7/1996 | Levy ............................ 324/754 |
| 5,557,213 | 9/1996 | Reuter et al. . |
| 5,576,631 | 11/1996 | Stowers et al. . |
| 5,600,259 * | 2/1997 | Bartyzel et al. ................ 324/761 |
| 5,663,655 | 9/1997 | Johnston et al. . |

* cited by examiner

*Primary Examiner*—Ernest Karlsen
(74) *Attorney, Agent, or Firm*—Piper Marbury Rudnick & Wolfe

(57) ABSTRACT

A wireless assembly for communicating electrical signals between test equipment and a unit under test using contact probes having at a first end a head electrically connected to a test point on the unit under test and a contact at a second end. The wireless assembly includes a translator board electrically connected to the test equipment; a probe plate in a spaced relationship with the translator board, at least one probe socket having a compression ring and a contact, the probe socket being fitted through holes in the probe plate; and a contact receptacle provided on and electrically connected to the translator board. The contact receptacle provides wireless electrical interconnection between the probe and the translator board by exerting only a circumferential force on the probe, generally without exerting a static force on the translator board. The contact receptacle is configured to eliminate transient forces caused by flexure of the probe plate from being transmitted to the translator board. Further, in densely populated units under test, standard vias, i.e., a via with industry standard plated-through hole diameter, may be used as test pads. The contact receptacle may be connected directly to vias on the translator board.

9 Claims, 7 Drawing Sheets

37

36

ZERO STATIC FORCE ASSEMBLY FOR WIRELESS TEST FIXTURES

FIELD OF THE INVENTION

The present invention relates to a wireless assembly used for in-circuit testing of printed circuit boards. More particularly, the present invention relates to a zero static force assembly for in-circuit testing of printed circuit boards. The zero static force assembly of the present invention provides reliable electrical contact between diagnostic or testing equipment and a unit under test without exerting forces which tend to damage the translator board in conventional in-circuit testing assemblies.

BACKGROUND OF THE INVENTION

Testing of complex electronic devices requires the reliable communication of signals between a unit under test and a testing assembly. Connections to components to be tested are made using external electrical probes applied to exposed test points (pads, vias, or other electrical contact points) on a unit under test.

Automatic testing of electrical circuits requires simultaneous connection to hundreds or thousands of circuit test points. A conventional test fixture used to provide electrical connection to a unit under test includes the so-called "bed-of-nails" assembly having a platform supporting an array of spring loaded probes. In operation, the unit under test (UUT) is placed on the platform and a force pushing the UUT into contact with the exposed probe ends is exerted, compressing the probes slightly, so as to ensure electrical connection therebetween.

The probes are electrically connected to test equipment in one of two common ways. According to one method, electrical connection is accomplished using fixed wiring. According to this method, dedicated wiring is attached between each probe and the test equipment. The dedicated wiring can take the form of wire wrapping in which a thin gauge wire is physically wrapped around an end of the probe. Alternatively, the dedicated wiring can be connected to the probe by force fitting each wire into a slot in each probe. An example of a probe adapted for this sort of wiring is found in U.S. Pat. No. 5,557,213 to Reuter et al. The labor involved in either method of dedicated wiring makes fixed wiring impractical for testing complex circuitry having thousands of test points. Moreover, this method of providing electrical connection between the test equipment and the probe suffers from a disadvantage in that it is difficult to replace a probe in the event of malfunction.

Alternatively, electrical connection may be achieved using a translator board. According to this method, the bottom probe head (in the case of a double-ended probe) is pressed into contact with a pad (electrical contact point) on a translator board, e.g. a printed circuit board, which is electrically connected to the test equipment, and the top probe head is pressed into contact with a corresponding test point on the UUT. This method for providing electrical interconnection provides many advantages over fixed wiring.

However, this method of providing electrical interconnection poses unique problems. Notably, the force required to maintain good electrical contact between the bottom probe head and the translator board tends, over time, to stress and eventually damage the translator board. See, e.g. FIG. 1.

FIG. 1 shows a conventional wireless assembly 2 used for testing a UUT. The wireless assembly 2 includes a translator board 14, a guide plate 28, and a probe plate 10. The guide plate 28 is supported in a spaced relationship with the translator board 14 by plural spacers 8 (only one spacer shown). In turn, the probe plate 10 is supported in a spaced relationship with the guide plate 28 by plural standoffs 30 (only one standoff shown). Each of the probe plate 10 and the guide plate 28 have corresponding holes configured to receive a double-ended probe socket 20.

The double-ended probe socket 20 is a generally elongated hollow body formed of an electrically conductive material. A spring loaded contact 12 is provided at a bottom end of the double-ended probe socket 20, and an opening configured to receive a probe 22 is provided at a top end thereof. The probe socket 20 is inserted through a corresponding hole defined in the probe plate 10 and guide plate 28. Notably, the guide plate 28 and the probe plate 10 provide lateral support for the probe socket 20. The open end of the probe socket 20 is configured to receive an end of a probe 22.

The probe 22 is a conventional spring loaded electrical contact probe such as disclosed in U.S. Pat. No. 4,814,698 to Johnston et al. The probe 22 has a spring loaded head for making electrical contact with a unit under test 18. In operation, a unit under test 18 is placed on the probe heads such that each head is positioned in contact with a test point 16 on the UUT 18. Next, a force F1 along a longitudinal direction of the probe (shown by a corresponding arrow F1 in FIG. 1) pressing the UUT 18 into contact with the head of the probe 22 ensures firm electrical connection therebetween.

Force F2 is exerted by the bottom head (contact) 12 of the probe socket 20, pushing the contact 12 downward into contact with the translator board 14. To ensure reliable electrical connection, the force F2 must be sufficient to properly compress the spring loaded contact 12 of the double-ended probe socket 20. Force F1 and F2 are independent of each other.

The total force required to compress the spring loaded contact 12 of each of the hundreds or even thousands of probes required to test the complex circuitry of a UUT is considerable. In a conventional assembly 2 this force is transmitted to and tends to cause permanent damage to the translator board.

By manner of example, a typical probe requires approximately four ounces of pressure to compress the springs and provide reliable electrical connection. Thus, a test fixture having 200 probes would require 200×4=800 ounces, i.e., fifty pounds of pressure! This force is constantly (statically) exerted upon the translator board and tends, over time, to permanently damage the translator board.

A further problem affecting conventional test assemblies relates to transient forces which are transmitted to the translator board each time a force F1 is applied to the UUT. This problem exists in conventional assemblies despite the use of standoffs. Notably, the transient forces are caused by flexure of the probe plate when subjected to the applied load during testing. Over time the transient force cycles cause wearing of the conductive plating of the pads 17 on the translator board. Ultimately, these transient force cycles result in unreliable electrical connection between the double ended probe socket bottom head 12 and the translator board 14.

Accordingly, a need exists for a test assembly which maintains good electrical contact between a testing assembly and UUT, does not require fixed wiring, and does not exert static forces on the translator board. A need further exists for a test assembly which provides enhanced flexibility without requiring the use of double-ended probes. Still further, a need exists for a test assembly which eliminates or substantially reduces the transient forces exerted on the translator board.

SUMMARY OF THE INVENTION

Briefly, the present invention includes a wireless assembly for communicating electrical signals between test equipment and a unit under test using a probe. The probe has a head which is electrically connected to the unit under test, and a contact at an opposing end along a longitudinal direction of the probe. The probe contact is operably connected to a selected contact point on the translator board and provides reliable, wireless electrical connection therebetween without exerting a static force on the translator board.

According to a first embodiment the assembly includes a translator board which is electrically connected to the test equipment. The translator board is a printed circuit board having exposed conductive pads which are electrically connected to corresponding test points on the unit under test. The assembly further includes a contact receptacle providing reliable electrical interconnection between the probe and the translator board generally without exerting a static force on the translator board.

The assembly may be optionally provided with a guide plate for providing lateral support for the contact receptacle.

According to another embodiment, the assembly further includes a probe socket having a contact. The probe socket is a generally elongated hollow tube composed of an electrically conductive material. A contact post is provided at a bottom end of the probe socket, and an opening is provided at a top end along a longitudinal direction of the socket. The open end of the probe socket is configured to receive a conventional probe. In operation the probe socket is press fit through holes defined in the probe plate and provides electrical interconnection between the probe and the translator board.

According to another embodiment, the assembly includes a probe plate in a spaced relationship with the translator board (and guide plate, if provided) and having holes defined therethrough. The probe plate in cooperation with the probe socket helps isolate pressing forces on the probe head from the translator board.

These and other aspects of the invention will be more fully understood by preferring to the following detailed description and the accompanying drawings.

DETAILED DESCRIPTION OF THE INVENTION

Figure 2:
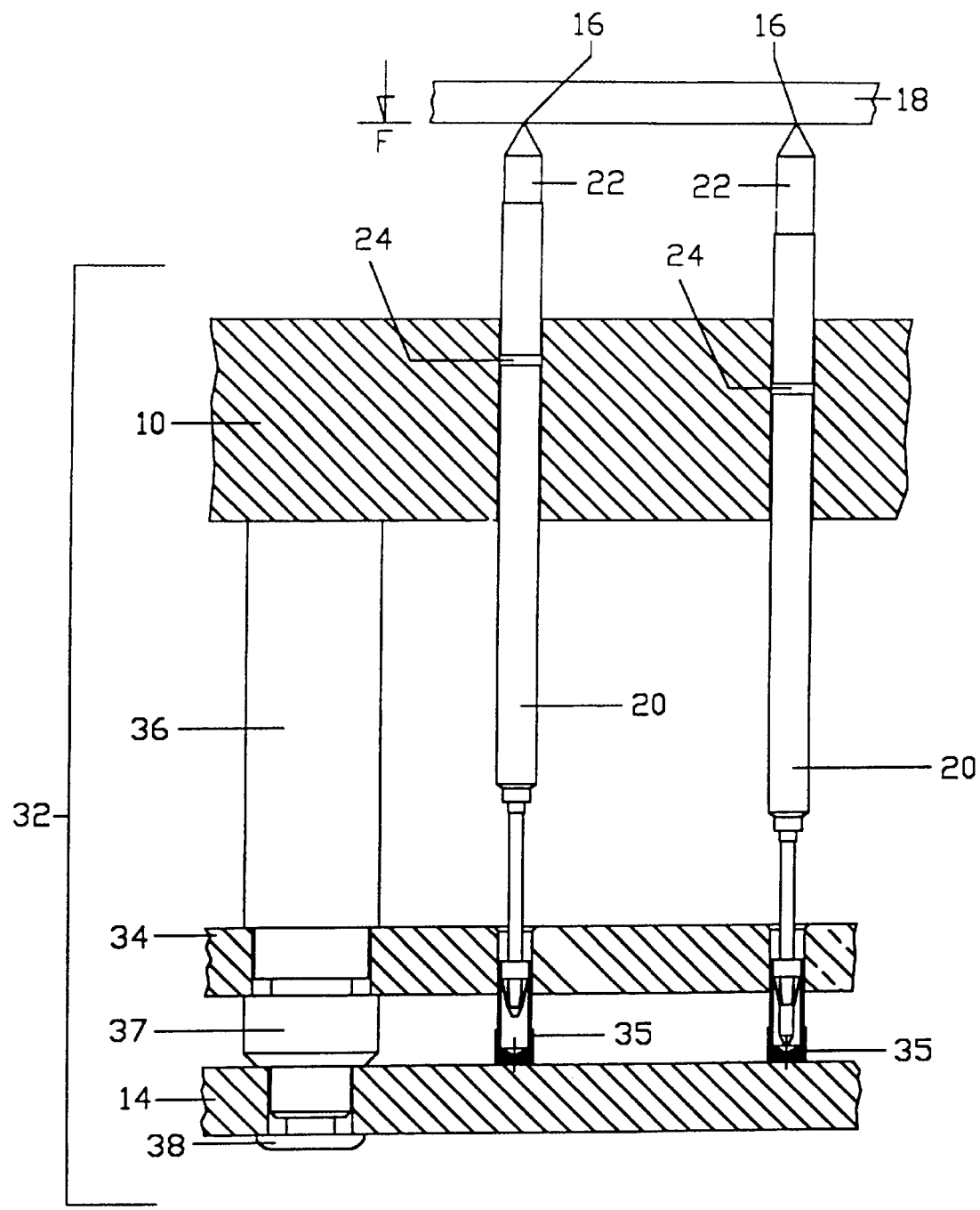
FIG. 2 is a view of one embodiment of the present invention.

FIG. 2 shows a first embodiment of the zero static force assembly (ZSF) 32 of the present invention. The ZSF 32 is a wireless assembly for communicating electrical signals between test equipment (not shown) and a unit under test 18. Electrical connection between the ZSF 32 and the UUT 18 is achieved using probe sockets 20 having a probe 22 making electrical contact with a test point 16 on the UUT 18. Moreover, the probe socket 20 is electrically connected to a translator board 14 of the ZSF 32 by a contact post at an opposing end of the socket 20. In turn, the translator board 14 is electrically connected to test equipment (not shown).

The translator board 14 may be a printed circuit board or the like, and may include passive and or active components (not illustrated) as required for conditioning the electrical signals communicated between the UUT and the test equipment. Conductive pads 42 (FIG. 3) or vias 44 (FIG. 7), formed of exposed copper or the like, provided on an exposed surface of the translator board 14 subsequently provide electrical connection between the UUT and the test equipment.

Figure 3:
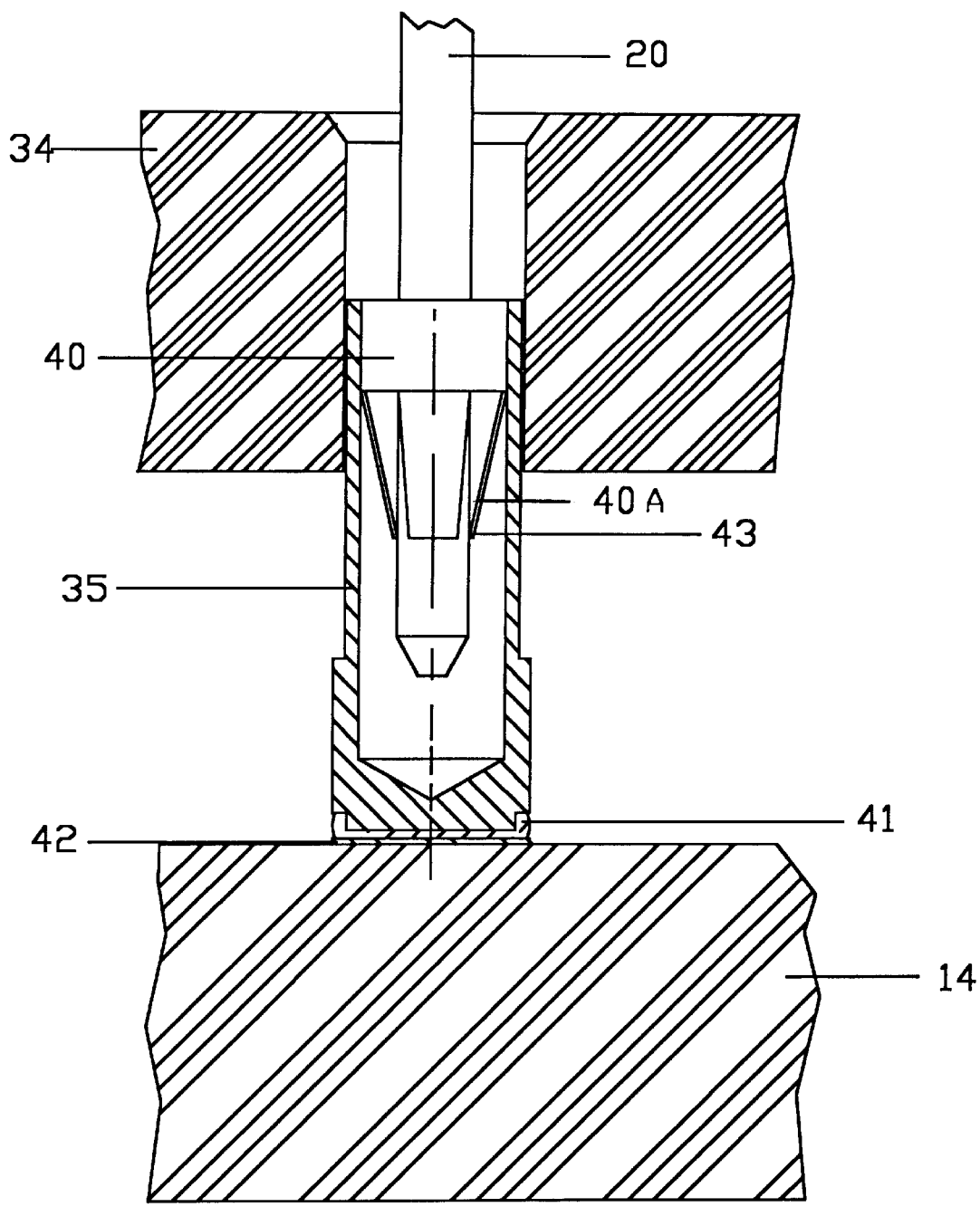
FIG. 3 is an enlarged view of a portion of the embodiment of FIG. 2.
Figure 4A:
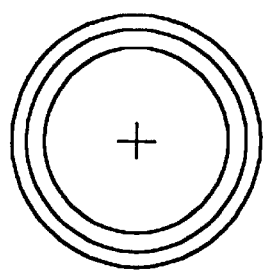
FIG. 4A is a top view of the contact terminal of FIGS. 2 and 3.
Figure 4B:
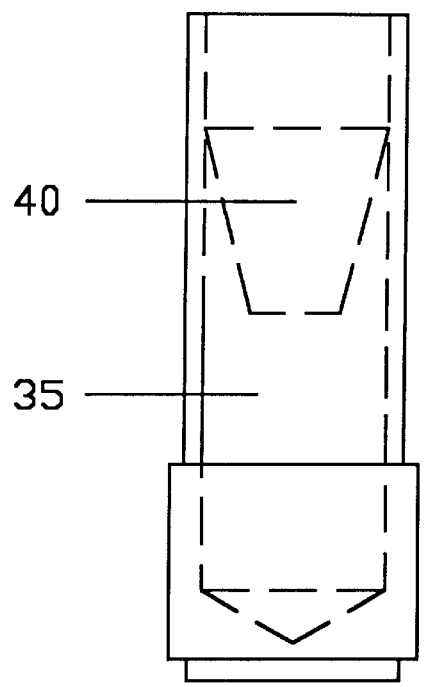
FIG. 4B is a sectional view of the contact terminal of FIGS. 2 and 3.
Figure 4C:
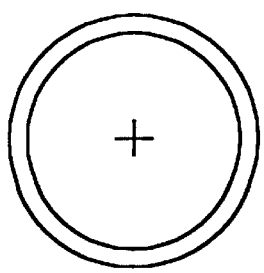
FIG. 4C is a bottom view of contact terminal of FIGS. 2 and 3.
Figure 7:
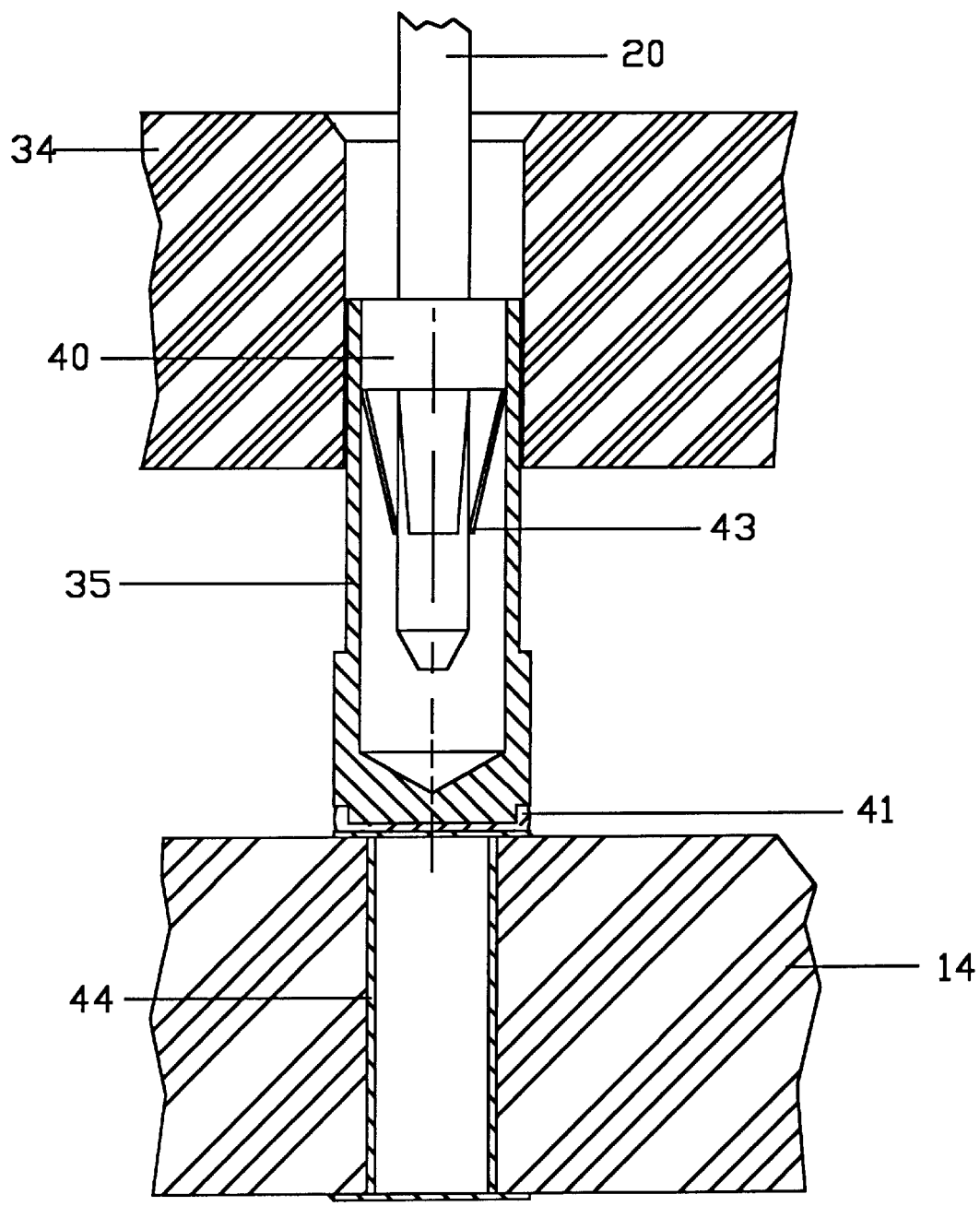
FIG. 7 is an enlarged view of a portion of the embodiment of FIG. 2.

A contact receptacle 35 including an integrated contact 40 having plural flexible conductive finger contacts 40a is provided on and electrically connected to the pads 42 or vias 44 on the translator board 14. The connection of the contact receptacle 35 to the pads 42 on the translator board 14 is best seen in FIG. 3. Notably, solder or solder paste 41 may be used to ensure reliable electrical connection between the pads 42 and the contact receptacle 35. Likewise, the connection of the contact receptacle 35 to the vias 44 on the translator board 14 is best seen in FIG. 7. Notably, solder or solder paste 41 may be used to ensure reliable electrical connection between the vias 44 and the contact receptacle 35. An enlarged view of the contact receptacle is provided in FIG. 4. Moreover, the conductive pads, vias or the like may provide electrical interconnection between different conducting layers (not shown) of the translator board.

Importantly, the contact receptacle 35 is configured to maintain reliable electrical connection between the contact 40 and a probe socket post or like electrical conductor by exerting a swiping force in a circumferential direction of the contact 40, without exerting a static force on the translator board 14. In FIG. 3, reference number 43 designates the circumferential interface between the contact receptacle 35, contact 40 and the probe socket 20 post.

In addition to eliminating or substantially minimizing the static force on the translator board 14, the contact receptacle 35 facilitates ease of manufacturing and is consistent with the demands of miniaturization. Notably, a difficulty arises in conventional assemblies in providing electrical connection between a miniature double ended probe and a via used as a test pad on the translator board. This problem occurs because the miniature double ended probe head may be smaller than the required via plated-through hole diameter. The via hole diameter constraint is necessitated by various manufacturing concerns. Generally, a larger plated-through hole diameter is required for a thicker translator board. Conventional assemblies overcome this mismatch in dimension of the via and probe head by providing a conductive pad electrically connected to the via, wherein the probe head is indirectly connected to the via through the conductive pad. However, the provision of additional conductive pads wastes valuable space on the translator board and may be difficult to implement in testing a densely packed UUT.

The contact receptacle of the present invention overcomes the aforementioned difficulties associated with miniature probes. Specifically, the contact receptacle 35 may be directly connected to the via 44 (FIG. 7), and provides reliable electrical connection with the via without unduly constraining the size of the via plated-though hole diameter.

Figure 5A:
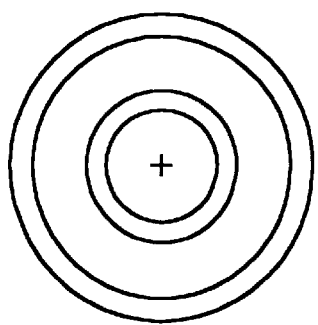
FIG. 5A is a top view of the insertion-extraction spacer of FIG. 2.
Figure 5B:
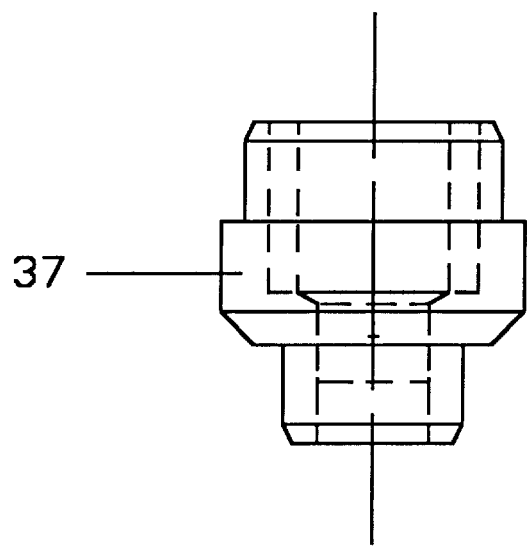
FIG. 5B is a sectional view of the insertion-extraction spacer of FIG. 2.
Figure 5C:
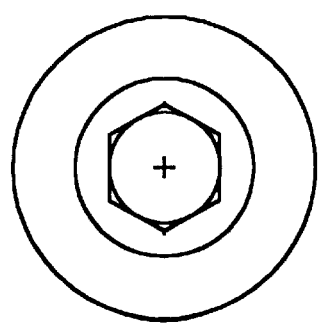
FIG. 5C is a bottom view of insertion-extraction spacer of FIG. 2.

According to one embodiment of the present invention, the ZSF 32 includes a guide plate 34 in a spaced relationship with the translator board 14. The spacing between the guide plate 34 and the translator board 14 may be maintained using insertion-extraction spacers 37 or the like (only one insertion-extraction spacer illustrated). An enlarged view of the insertion-extraction spacer 37 is provided in FIG. 5. The guide plate 34 provides additional lateral support to the contact receptacle 35 (best seen in FIG. 3).

Figure 6A:
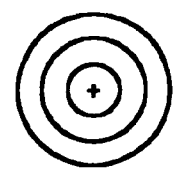
FIG. 6A is a top view of the standoff of FIG. 2.
Figure 6B:
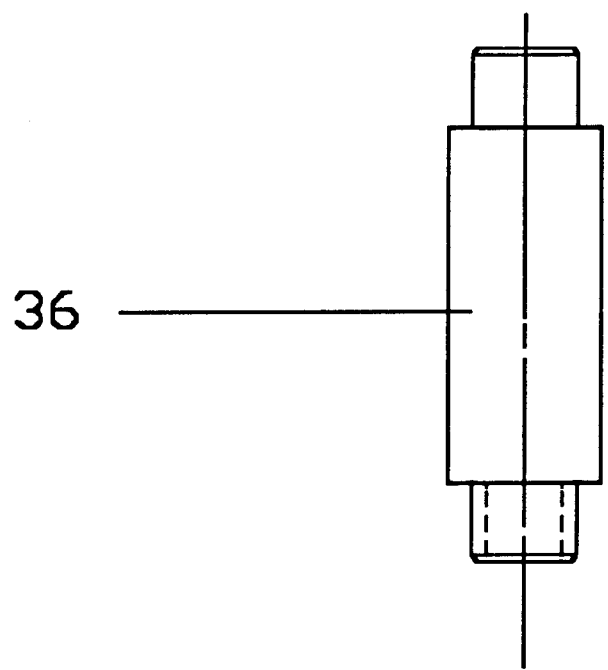
FIG. 6B is a sectional view of the standoff of FIG. 2.
Figure 6C:
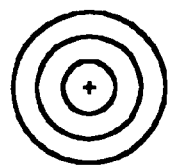
FIG. 6C is a bottom view of standoff of FIG. 2.

In the embodiment shown in FIG. 2, the translator board 14, insertion-extraction spacer 37, and guide plate 34 are operably connected to a standoff 36 by an insertion-extraction screw 38. An enlarged view of the standoff 36 is provided in FIG. 6. However, other ways for maintaining a fixed spatial relationship between the translator board 14 and the guide plate 34 are envisioned.

According to one embodiment of the present invention, the ZSF 32 includes a probe socket 20 having a open proximate end, a contact at a distal end, and a compression ring 24 formed on an external circumferential surface therebetween.

The ZSF 32 further includes a probe plate 10 in a spaced relationship with the translator board 14. The probe plate 10 is provided with holes whose location corresponds to the position of the contact receptacles 35. The probe socket 20 is inserted through the holes in the probe plate 10. Moreover, interference between the compression ring 24 and the hole helps to fix the probe socket 20 within the probe plate 10, and isolate external forces F applied to the probe socket 20 from the probe 22 from being transferred to the translator board 14.

The spacing between the probe plate 10 and the translator board 14 may be maintained by a standoff 36. However, in the embodiment of FIG. 2, the standoff is provided between the probe plate 10 and the guide plate 34.

Figure 1:
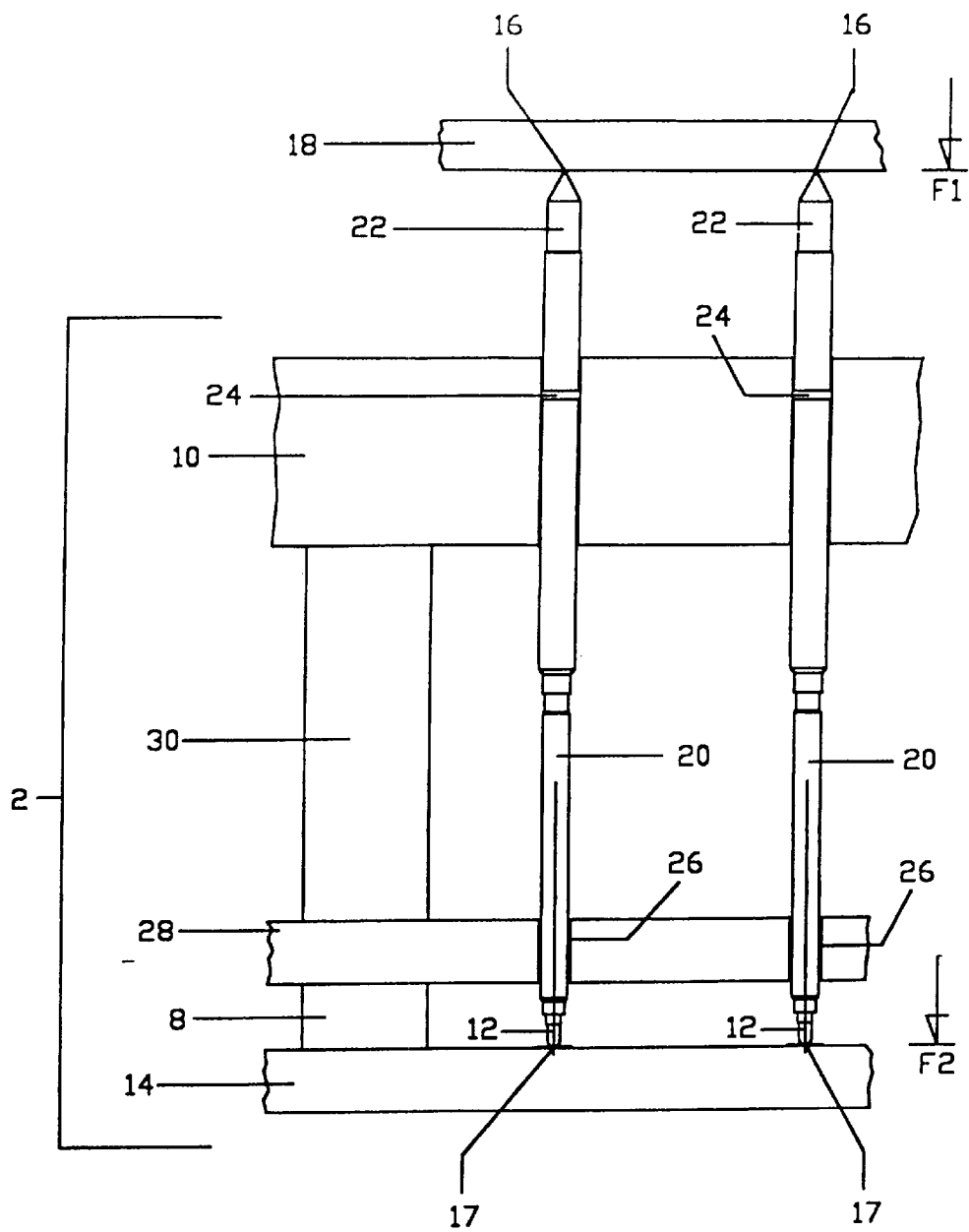
FIG. 1 is a view of a conventional test fixture.

It should be noted that in conventional test assemblies, transient forces may be transmitted to the translator board each time a UUT is tested. This problem exists in conventional assemblies despite the use of a probe socket equipped with a compression ring (see, e.g., FIG. 1). This situation results from flexure of the probe plate 10 when subjected to the applied load F1 during testing. Notably, the transient force cycles cause wearing of the pads 17 on the conventional translator board. Ultimately, these transient force cycles result in unreliable electrical connection between the double ended probe bottom head 12 and the translator board 14.

The present invention addresses the problem of transient forces through the unique structure of the contact receptacle. Notably, the length of the contact receptacle 35 along a longitudinal direction is configured to accommodate the slight travel of the probe socket 20 caused by flexure of the probe plate. Consequently, transient forces are prevented from being transmitted to the translator board 14.

According to another embodiment of the present invention, the ZSF 32 further includes a guide plate 34 in a spaced relationship with the translator board 14. The guide plate 34 is provided with holes whose location corresponds to the position of the contact receptacles 35.

In the preferred embodiment of the present invention, guide plate 34 is held in a fixed spaced relationship within the ZSF 32 by standoffs 36, insertion-extraction spacers 37 and insertion-extraction screws 38. Spacing between the guide plate 34 and the translator board 14 is maintained by the insertion-extraction spacers 37, and standoffs 36 are permanently secured to the probe plate 10.

In the preferred embodiment of the invention, the guide plate 34 and translator board 14 are removably connected to a threaded end of the standoff 36. Notably, the threaded end of the standoff is threadably connected to the insertion-extraction spacer 37 (FIG. 2), fixing the guide plate in a spaced relationship with the probe plate 10. Further, the threaded end of the standoff 36 is threadably connected to the insertion-extraction screw 38, fixing the translator board 14 in a spaced relationship with the guide plate 34.

One of ordinary skill in the art will appreciate that the nominal insertion depth of the probe socket 20 within the contact receptacle 35 is fixed at a predetermined depth by the standoffs 36 and the insertion-extraction spacers 37. In addition, the insertion-extraction spacers 37 provide a vertical gap between the guide plate 34 and the translator board 14, so as to provide sufficient clearance for additional point to point wiring and/or passive/active components mounted to the translator board 14.

Additionally, one of ordinary skill in the art will appreciate that the construction and height of the contact receptacle 35 and the position of its integral contact 40 enable it to compensate for variances in the insertion depth of each probe socket 20 within its corresponding contact receptacle 35.

Although a preferred embodiment of the zero static force assembly for wireless test fixtures has been specifically described and illustrated, it is to be understood that variations or alternative embodiments apparent to those skilled in the art are within the scope of this invention. Since many such variations may be made, it is to be understood that within the scope of the following claims, this invention may be practiced otherwise than specifically described.

What is claimed is:

1. A wireless assembly for communicating electrical signals between test equipment and a unit under test using a probe having a spring-loaded head at a first end for electrical connection to a test point on the unit under test and having a contact at a second end which is at least partially received within a probe socket, the probe socket terminating in a post, said wireless assembly comprising:

a translator board electrically connected to the test equipment;

a contact receptacle provided on and electrically connected to said translator board, said contact receptacle including a conductive shell having plural flexible conductive finger contacts. said contact receptacle being configured to at least partially receive the probe socket post and provide wireless electrical interconnection between the probe and said translator board;

wherein said plural flexible conductive finger contacts are configured to swipe and exert a pressing force on a circumferential portion of the probe socket post thereby maintaining electrical interconnection with the probe as the probe travels within said contact receptacle;

wherein said contact receptacle isolates said translator board from forces exerted on the probe by enabling the probe to travel a predefined distance within the contact receptacle without contacting a bottom portion of said contact receptacle.

2. A wireless assembly for communicating electrical signals according to claim 1, further comprising:

a probe plate in a spaced relationship with said translator board, said probe plate supporting the probe socket and generally maintaining a fixed relationship between of the probe socket and the translator board;

wherein a length of said contact receptacle is configured to allow travel of the probe socket post toward the translator board during flexure of said probe plate while maintaining electrical connection between the probe socket post and the contact receptacle, and while isolating the translator board from forces exerted on the probe.

3. A wireless assembly for communicating electrical signals according to claim 1, further comprising:

a via defined in said translator board providing electrical interconnection between different conducting layers of said translator board; and said contact receptacle is electrically connected to said via, whereby said contact receptacle enables a size of said via to be set independent of a size of the probe socket post.

4. A wireless assembly for communicating electrical signals according to claim 1, wherein a length of said contact receptacle is configured to enable different set heights measured between a top end portion of the probe socket and a top face of the translator board, while maintaining consistent electrical connection therebetween.

5. A wireless assembly for communicating electrical signals between test equipment and a unit under test using a single headed probe removably engaged with a probe socket terminating in a post said wireless assembly comprising:

a translator board electrically connected to the test equipment;

a contact receptacle including a conductive shell housing a plurality of flexible conductive finger contacts configured to slidably engage the probe socket post;

a probe plate held in a spaced relationship with said translator board by a plurality of standoffs, said probe plate supporting the probe socket in a fixed relationship to said translator board, wherein said probe plate tends to bow in an unsupported portion between adjacent standoffs, thereby causing the probe socket to travel towards said translator board;

wherein said plurality of flexible conductive finder contacts maintain electrical connection with the probe socket post as the probe socket travels due to bowing of said probe plate further wherein a length of said contact receptacle is configured to enable the probe socket post to travel toward said translator board during bowing of said probe plate without contacting a bottom portion of said contact receptacle, thereby isolating said translator board from forces exerted on the probe.

6. A wireless assembly for communicating electrical signals according to claim 5, further comprising:

a via defined in the translator board providing electrical interconnection between different conducting layers of the translator board; and said contact receptacle is electrically connected to said via, whereby said contact receptacle enables a size of said via to be set independent of a circumference of the probe socket post.

7. A wireless assembly for communicating electrical signals according to claim 5, wherein said contact receptacle maintains electrical connection with said probe socket contact by exerting a force in a circumferential direction of said probe socket contact.

8. A wireless assembly for communicating electrical signals according to claim 5, wherein a length of said contact receptacle along a longitudinal direction is configured to allow travel of said probe socket toward said translator board so as to generally isolate forces causing flexure of said probe plate from being transmitted to said translator board.

9. A wireless assembly for communicating electrical signals according to claim 5, wherein a length of said contact receptacle is configured to enable different set heights measured between a top end portion of said probe socket and a top face of said translator board, while maintaining consistent electrical connection therebetween.

* * * * *

UNITED STATES PATENT AND TRADEMARK OFFICE
CERTIFICATE OF CORRECTION

PATENT NO. : 6,208,158 B1  Page 1 of 1
DATED : March 27, 2001
INVENTOR(S) : Charles A. Schein, Silvano A. Romeo It is certified that error appears in the above-identified patent and that said Letters Patent is hereby corrected as shown below:

<u>Column 4,</u>
Line 34, "finder" is changed to "finger"

Signed and Sealed this

Fifth Day of March, 2002

*Attest:*

JAMES E. ROGAN
*Director of the United States Patent and Trademark Office*

*Attesting Officer*